United States Patent [19]

Okada et al.

[11] Patent Number: 4,813,016

[45] Date of Patent: Mar. 14, 1989

[54] TUNNEL MEMORY DEVICE HAVING A MULTI-LAYERED LANGMUIR-BLODGETT FILM

[75] Inventors: Takao Okada, Hachioji; Masamichi Morimoto, Fuchu, both of Japan

[73] Assignee: Olympus Optical Co., Ltd., Tokyo, Japan

[21] Appl. No.: 947,504

[22] Filed: Dec. 29, 1986

[30] Foreign Application Priority Data

Jan. 14, 1986 [JP] Japan .................................. 61-5581

[51] Int. Cl.$^4$ ...................... G11C 13/02; H01L 29/28
[52] U.S. Cl. .................... 365/107; 365/106; 357/6; 357/8
[58] Field of Search ............... 365/106, 107, 149, 120, 365/127, 129; 357/6, 8, 4, 7

[56] References Cited

U.S. PATENT DOCUMENTS

| | | | |
|---|---|---|---|
| 4,217,601 | 8/1980 | Dekeersmaecker et al. | 357/6 |
| 4,534,015 | 8/1985 | Wilson | 365/106 |
| 4,627,029 | 12/1986 | Wilson | 365/107 |
| 4,670,860 | 6/1987 | Wilson | 365/107 |

OTHER PUBLICATIONS

Roberts et al, "Technological Applications of Langmuir-Blodgett Films", Phys. Technol., vol. 12, 1981, pp. 69-87.

Primary Examiner—Stuart N. Hecker
Assistant Examiner—Glenn A. Gossage
Attorney, Agent, or Firm—Frishauf, Holtz, Goodman & Woodward

[57] ABSTRACT

A three-dimensional tunnel memory device includes a multilayer Langmuir-Blodgett film wherein each layer can store or carry an electric charge. Charges are introduced into one side of the film in a time sequence corresponding to the information to be carried. An electric field is applied between the faces of the film to cause the charge stored by any layer to be transferred to the adjacent layer, and for thus reading out the sequence of charges stored by the film. The multilayer Langmuir-Blodgett film includes memory unit cells each comprising Langmuir-Blodgett films formed, respectively, of different kinds of organic compounds and contacting each other. Electric fields of different magnitudes are applied, respectively, to the film constituting each memory unit cell thereby allowing the stored charge in each film constituting the memory unit cell to hop the tunnel barrier.

4 Claims, 7 Drawing Sheets (POISSON DISTRIBUTION)

$$P_i = N \frac{m^i e^{-m}}{i!}$$
$$N = 10000, \quad i = 1 \cdot 2 \cdots n$$

( LARGE ELECTRIC FIELD : E1 )

( SMALL ELECTRIC FIELD : E2 )

F I G. 8A
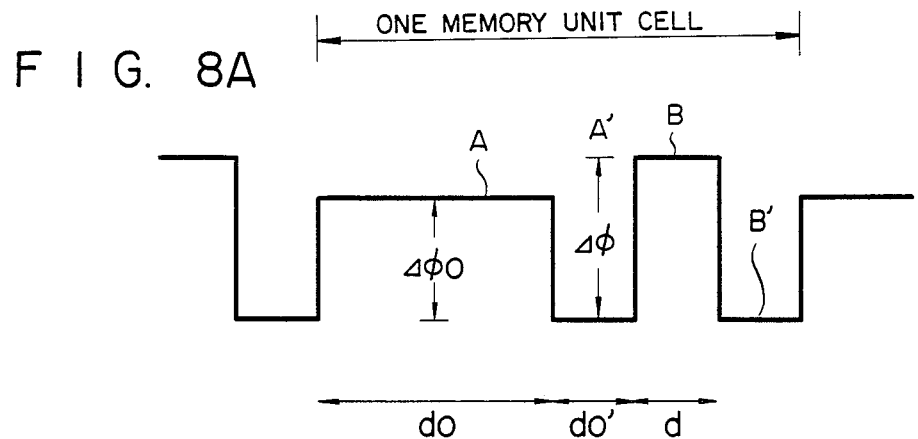
F I G. 8B
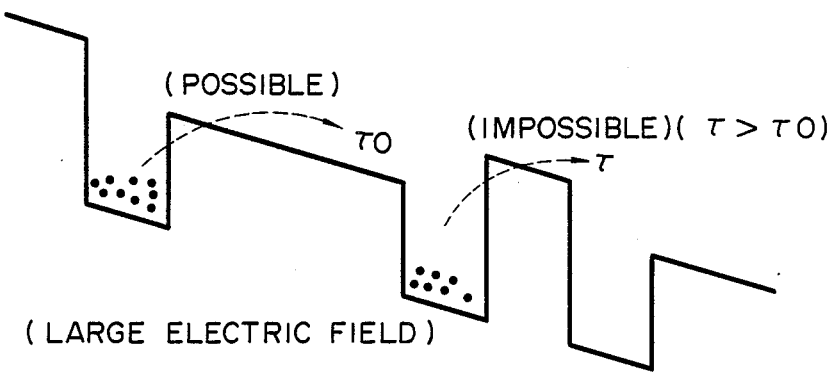
F I G. 8C
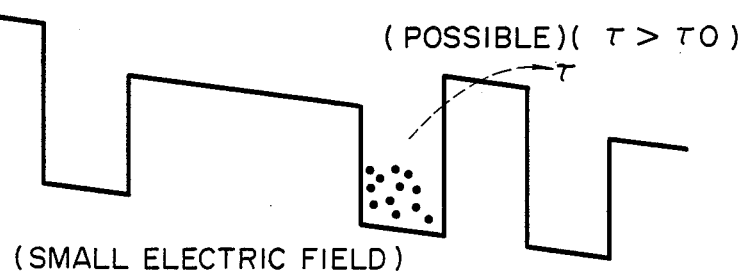

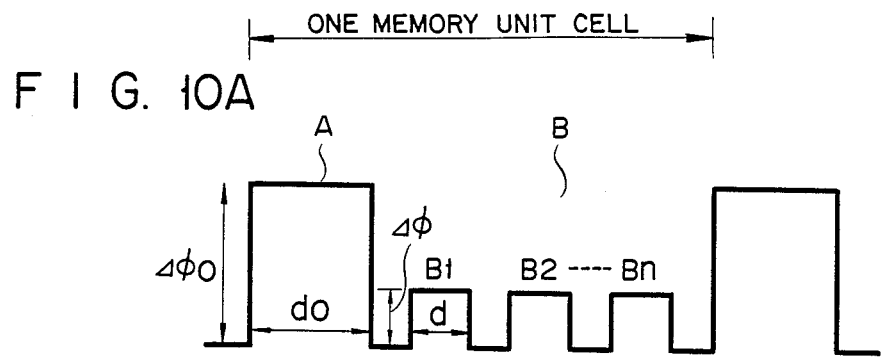
F I G. 10A
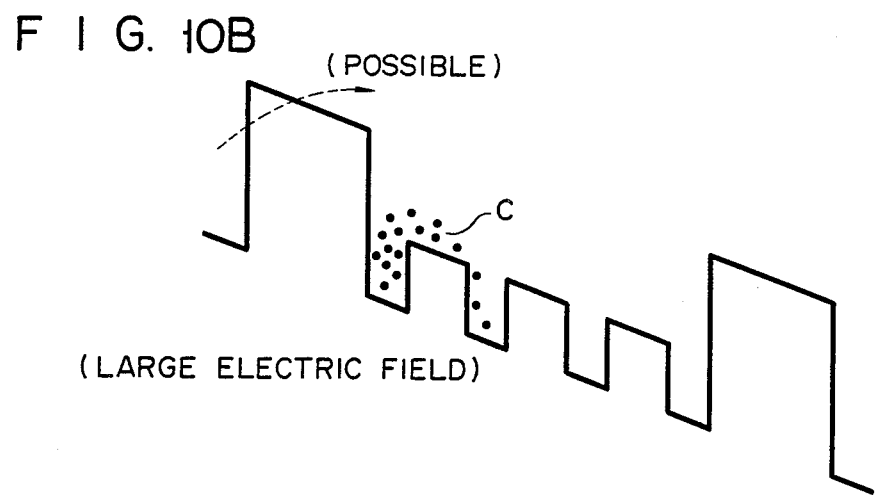
F I G. 10B
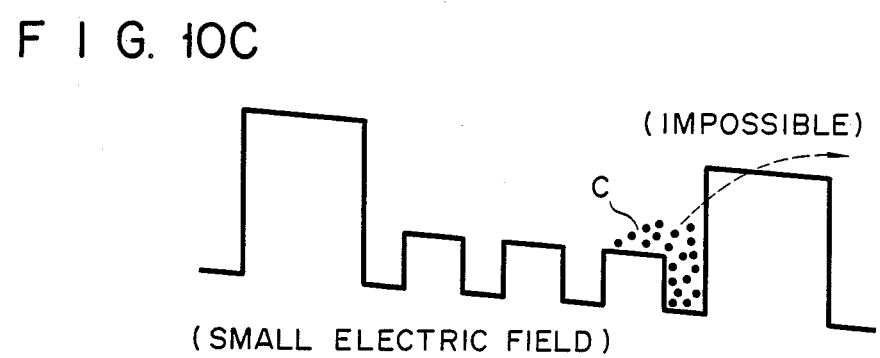
F I G. 10C

TUNNEL MEMORY DEVICE HAVING A MULTI-LAYERED LANGMUIR-BLODGETT FILM

BACKGROUND OF THE INVENTION

1. Field of the Invention

The present invention relates to a three-dimensional tunnel memory device using as a memory element a multilayer Langmuir-Blodgett film wherein each layer can store charge.

2. Description of the Prior Art

A decrease in semiconductor integration orders has had considerable impact on the industrial fields, but micropatterning of semiconductor elements is not advancing. In conventional systems and fabrication techniques, devices of 0.1-$\mu$m rule are regarded as having the smallest size. Under these circumstances, demand has arisen for large-capacity memories.

In order to satisfy such needs, extensive studies have been made recently on three-dimensional integrated circuits that are aiming at a high packing density, multi-functional performance, and high-speed operation.

For example, in the field of various recording media such as auxiliary memories, a three-dimensional recording medium is proposed by E. G. Wilson instead of a conventional two-dimensional one in order to achieve a high memory capacity and compactness. This memory utilizes as a memory element a multilayer Langmuir-Blodgett film, as described in document No. EP007135A1 or U.S. Pat. No. 4,534,015.

In general, an organic compound having both hydrophilic and hydrophobic groups can be expanded or developed as a monomolecular film on the water surface. Particularly, an organic compound having a hydrophilic group at one terminal and a hydrophobic group at the other terminal wherein the intensities of the hydrophilicity and hydrophobicity are the same (e.g., a soap), can be easily expanded to have a monomolecular thickness on the water surface with the hydrophilic group contacted with water. Such monomolecular films can be stacked on a substrate when the substrate is repeatedly moved across the expanded monomolecular film on the water, while maintaining a predetermined surface pressure. The resultant film is the multilayer Langmuir-Blodgett (LB) film.

The hydrophilic and hydrophobic groups can serve as potential barriers against electric charge, and the charge can be stored in a portion (i.e., a portion other than the hydrophilic and hydrophobic groups) of the monomolecules. Therefore, in a multilayer LB film, the charge can be stored in each monomolecular layer. In addition, the potential barrier constituted by the hydrophilic and hydrophobic groups has a height enough to allow tunnel hopping of the charge, and the charge can be transferred from on monomolecular layer to the adjacent monomolecular layer by an electric field. Using this principle, the charge can be stored in each layer, and information can be written or read by the electric field. A memory utilizing the above principle is the three-dimensional memory medium (device) proposed by E. G. Wilson.

FIG. 1 shows a schematic arrangement of this three-dimensional memory device. As shown in FIG. 1, the memory device includes multilayer LB film 11 wherein each layer can store or carry electric charges and therefore information, and means 12 for introducing charges into one side of the film in a time sequence corresponding to the information to be carried. The charge introducing means is located near the one side of the film 11, and constituted by, e.g., optical modulator. The memory device is also provided with means 13 for applying an electric field between the two faces of film 11 so as to transfer the charge from any layer to an adjacent layer, and readout means 14 for reading out a charge sequence stored by film 11.

In the memory device proposed by E. G. Wilson, when the magnitude of an electric field applied during tunnel hopping exceeds a given value, the charge is transferred in a state wherein the charge distribution in the memory medium is limited within a monomolecular layer of the LB film. However, since the tunnel hopping phenomenon is a probabilistic even with a "fluctuation", the probability distribution of the charge is spread along the transfer direction. From the probabilistic viewpoint, when the center of a memory charge pulse is transferred by a distance corresponding to m layers, the width of charge spreading is analyzed to extend as a Poisson distribution over $\sqrt{m}$ layers.

When the charge is transferred in a spreading state as noted above, the readout cannot be performed accurately.

SUMMARY OF THE INVENTION

It is, therefore, an object of the present invention to provide a three-dimensional tunnel memory device capable of transferring electric charge in a state wherein probabilistic spreading of charge is sufficiently suppressed.

The present invention is directed to an improvement of the above-noted prior art three-dimensional tunnel memory device in that means for suppressing the charge spreading is provided for such device.

The three-dimensional tunnel memory device of the present invention includes, like the prior art memory device, a multilayer Langmuir-Blodgett film wherein each layer can store or carry an electric charge, means for introducing charges into one side of the film in a time sequence corresponding to the information to be carried, means for applying an electric field between the faces of the film to cause the charge stored by any layer to be transferred to the adjacent layer, and means for reading out the sequence of charges stored by the film. According to the present invention, the multilayer LB film includes memory unit cells each comprising LB films formed of different kinds of organic compounds and contacting each other. Electric fields of different magnitudes are applied to one film constituting each memory unit cell and to another film constituting the same memory unit cell thereby allowing the stored charge in each film constituting the memory unit cell to hop the tunnel.

In a first embodiment of the present invention, each memory unit cell is constituted by a first monomolecular film comprising a first organic compound having a large molecular length and low tunnel hopping barrier, and a second monomolecular film comprising a second organic compound having a molecular length smaller than said first compound and a tunnel hopping barrier lower that said first compound. The first and second monomolecular films are stacked such that the first film contacts the second film, thereby forming said multilayer LB film. In this embodiment, the charge stored in the first film is caused to tunnel hop the first film by applying, by said field applying means, a large electric field for a predetermined period of time to the memory unit cell, and the charge stored in the second film is caused to tunnel hop the second film by applying, by said field applying means, a small electric field for a period of time longer than that of the application of said high electric field to the memory unit cell.

In a second embodiment of the present invention, each memory unit cell is constituted by a first monomolecular film comprising a first organic compound having a predetermined tunnel hopping barrier, and a second monomolecular film comprising a second organic compound having a tunnel hopping barrier lower than said first compound and small charge transfer degree. The first and second monomolecular films are stacked such that the first film contacts the second film, thereby forming said multi-layer LB film. In this embodiment, the charge stored in the first film is caused to tunnel hop the first film by applying, by said field applying means, large electric field for a predetermined period of time to the memory unit cell, and the charge stored in the second film is caused to tunnel hop the second film by applying, by said field applying means, small electric field for a period of time longer than that of the application of said high electric field to the memory unit cell.

In a third embodiment of the present invention, each memory unit cell is constituted by a first monomolecular film comprising a first organic compound having a predetermined molecular length and predetermined tunnel hopping barrier, and a plurality of second monomolecular films comprising a second organic compound having a molecular length smaller than said first compound and a tunnel hopping barrier lower than said first compound. The first and second monomolecular films are stacked such that the first film contacts the second films, thereby forming said multi-layer LB film. In this embodiment, the charge stored in the first film is caused to tunnel hop the first film by applying, by said field applying means, large electric field for a predetermined period of time to the memory unit cell, and the charge stored in the second film is caused to tunnel hop the second films by applying, by said field applying means, small electric field for a period of time longer than that of the application of said high electric field to the memory unit cell to collect the charge in the final stage of the second films.

BRIEF DESCRIPTION OF THE DRAWING

FIGS. 8A to 8C illustrate the first embodiment of the present invention;

FIGS. 10A to 10C illustrate the third embodiment of the present invention.

DESCRIPTION OF THE PREFERRED EMBODIMENTS

Before describing the present invention, the charge spreading in the prior art memory device will be explained with reference to FIGS. 2 to 4.

Figure 1:
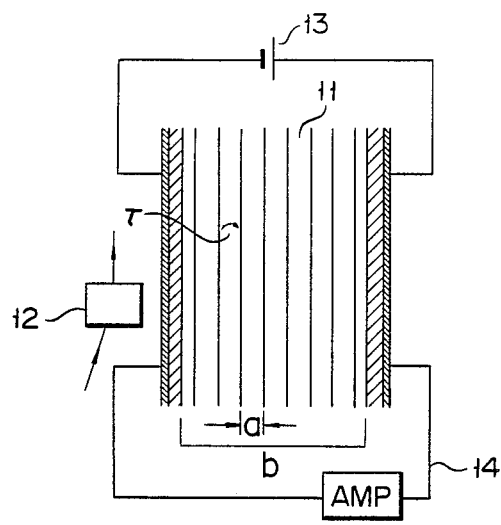
FIG. 1 schematically shows the prior art three-dimensional tunnel memory device.
Figure 2:
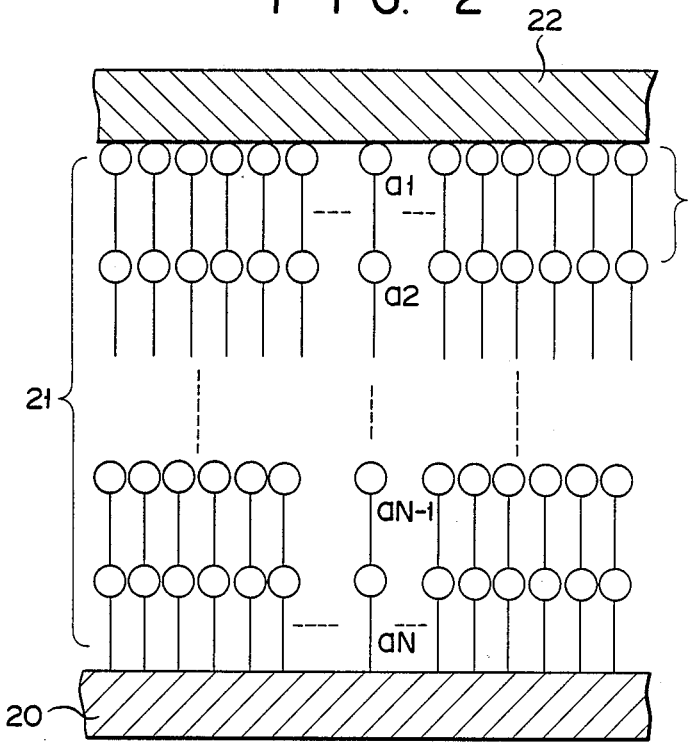
FIGS. 2 to 4 illustrate the charge spreading in the prior art memory device.

Assume that multilayer LB film 21 is formed of a plurality of monomolecular layers a1, a2, ... and is formed on semiconductor substrate 20 and that metal film 22 is formed on film 21 to constitute a MIS Schottky memory medium, as shown in FIG. 2. When the memory medium is biased such that metal film 22 is the negative side, the charge is transferred, as shown in FIG. 3.

Figure 3:
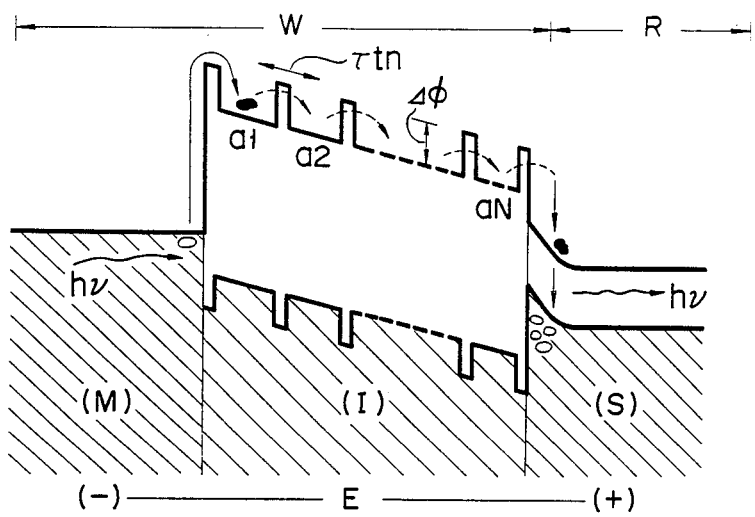

Referring to FIG. 3, reference symbol W denotes a write area; and R, a read area. Assume that no charge components are written in any first layer a1 at time t=0. Under this assumption, the number xi(t) (where i is the ith layer) of charge components existing in the respective layers at time t=tn is calculated.

If electric field E has a sufficiently large magnitude and reverse tunnel hopping (i.e., from the ith layer to the (i−1)th layer) does not occur, provided that even if reverse hopping occurs, reverse tunnel hopping is sufficiently small if considered in units of a few layers and thus is not an essential factor, then the following equation is derived:

$$dx(t)/dt = -1/\tau_{tn} \cdot (x_i - x_{i-1}) \qquad (1)$$

First term $(-1/\tau_{tn} \cdot x_i)$ of the right-hand side represents an effect of tunnel hopping of the charge transferred from the ith layer to the (i+1)th layer. Second term $(-1/\tau_{tn} \cdot x_{i-1})$ represents an effect of tunnel hopping of the charge injected from the (i−1)th layer to the ith layer. In equation (1), $\tau_{tn}$ is the tunnel hopping time of one barrier. Equation (1) can be rewritten under the following conditions:

If i=1, then $$dx_1(t)/dt = -x_1(t)/\tau_{tn}$$

therefore $$x_1(t) = n_0 \exp(-t/\tau_{tn}) \qquad (2)$$

If i=2, then $$dx_2(t)/dt = -x_2(t)/\tau_{tn} + 1/\tau_{tn} \cdot x_1(t)$$

therefore $$x_2(t) = n_0 \cdot t/\tau_{tn} \cdot \exp \tau - t/\tau_{tn}) \qquad (3)$$

If i=i, then $$x_i(t) = n_0/(i-1)! \cdot (t/\tau_{tn})^{i-1} \cdot \exp(-t/\tau_{tn}) \qquad (4)$$

Under the above conditions, if $m = t/\tau_{tn}$ then $$P_i \equiv x_i(t) = n_0/(i-1)! m^{i-1} \exp(-m) \text{ for } i=1, 2, 3, \qquad (5)$$

Equation (5) represents a Poisson distribution.

Figure 4:
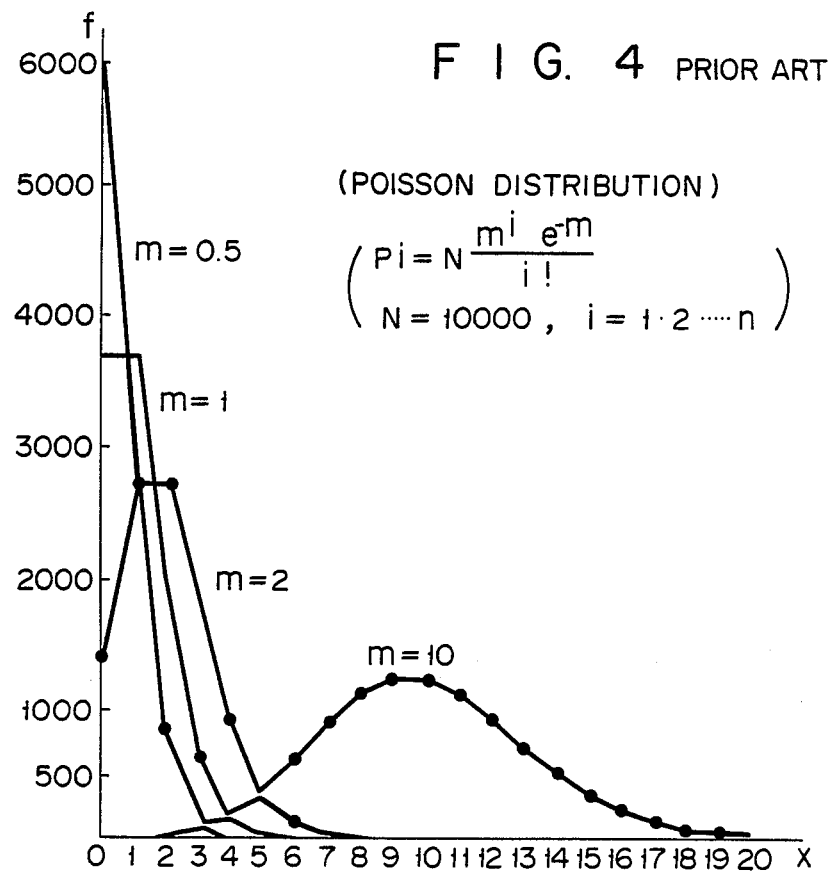

FIG. 4 is a graph showing the Poisson distribution. Predicted value $\bar{i}$ and standard deviation $\sigma(i)$ are defined as follows:

$$\bar{i} = m$$

$$\sigma(i) = \sqrt{m} \qquad (6)$$

As is apparent from equations (6), the charge is spread with a Poisson distribution.

Now, the principle of the present invention to suppress the charge spreading, namely, the basic concept for limiting a memory pulse width, will be described with reference to FIGS. 5 to 7C.

Figure 5:
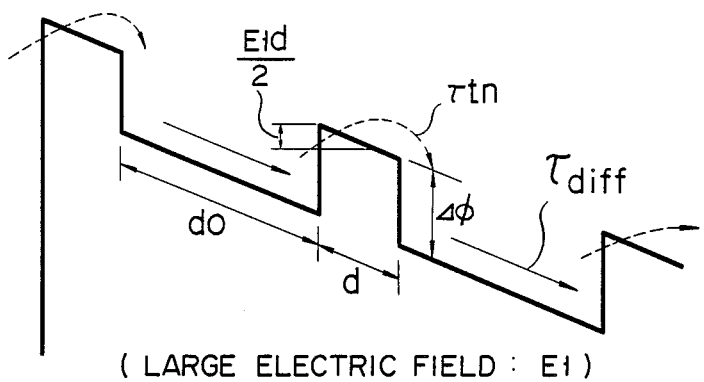
FIGS. 5 to 7C illustrate the principle of the present invention.

As shown in FIG. 5, when applied electric field E has a relatively large magnitude and tunnel hopping of the charge is allowed, the following condition must be satisfied to limit spreading of the memory pulse width:

$$\tau_{tn} < \tau_{diff} \tag{7}$$

where $\tau_{diff}$ is the time required for transferring charge through a portion excluding the barrier within the monomolecular layer. If condition (7) is satisfied, the charge cannot reach the next barrier during tunnel hopping of the charge.

Figure 6:
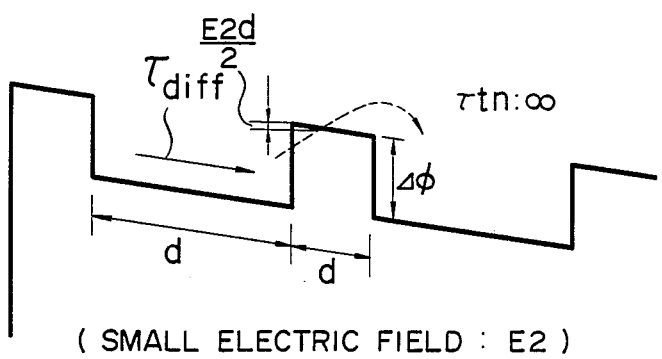

As shown in FIG. 6, if electric field E has a small magnitude, time $\tau_{diff}$ is finite, but time $\tau_{tn}$ is almost infinite. For this reason, tunnel hopping of the charge is now allowed. Quantitatively, the following relation is given. That is, electric field dependency of the tunnel barrier is defined as follows:

$$1/\tau_{tn} = \nu_{ph} \cdot \exp\{-(2/h)\sqrt{2me(\Delta\phi - Ed)} \cdot d\} \tag{8}$$

where $\nu_{ph}$ is the phonon frequency, me is the mass of the charge, h is the Dirac constant, d is the barrier width, and E is the electric field. More specifically, when a large electric field is applied, $(\Delta\phi - Ed)$ is reduced (i.e., a low tunnel hopping barrier) and time $\tau_{tn}$ is shortened. As a result, tunnel hopping of the charge over the barrier can easily occur.

As is apparent from equation (8), in order to shorten time $\tau_{tn}$, barrier width d, i.e., the molecular length may be increased instead of increasing the electric field.

Figure 7A:
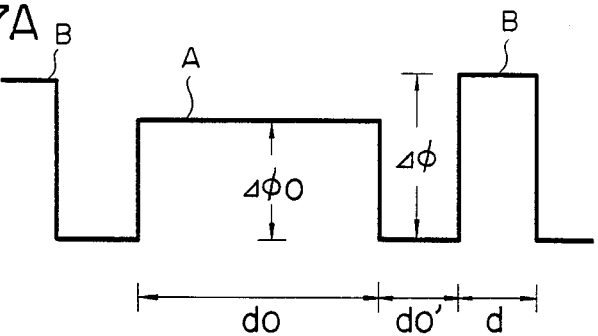
Figure 7B:
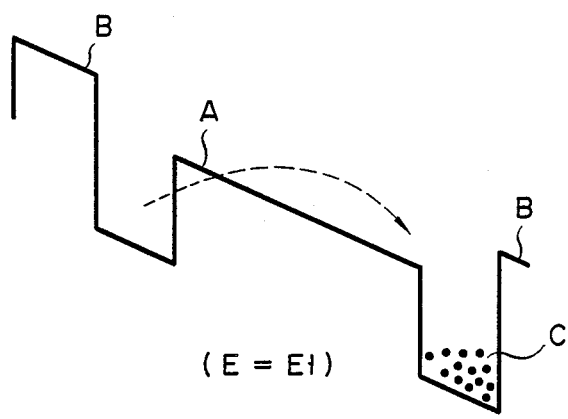
Figure 7C:
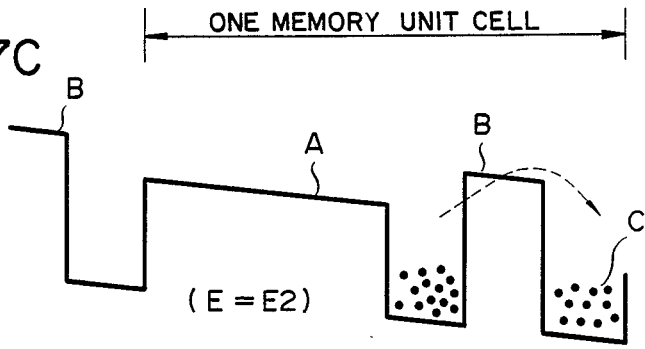

As shown in FIG. 7A, a memory unit cell consists of first and second monomolecular films A and B having different tunnel hopping barriers and different molecular lengths. If tunnel hopping of charge C over film A is effected, a high electric field given by E=E1 in FIG. 7B is applied to the memory device. However, if tunnel hopping of the charge over film B is effected, a low electric field given by E=E2 shown in FIG. 7(c) is applied to the memory device. Therefore, the charge can be transferred through the monomolecular layers such that spreading of the charge pulse can be limited.

Portion $d_0$ may be made of molecules having small charge mobility ($\mu$) or a plurality of monomolecular films having a small $\Delta\phi$ so as to satisfy equation (7). When tunnel hopping is effected in portion d, a large electric field may be applied to the memory device and in the other case a small electric field may be applied. Therefore, three different structures of the memory cell can be proposed:

(1) A memory unit cell is constituted by two monomolecular layers comprising two organic compound having different tunnel hopping barriers and different molecular lengths;

(2) A memory unit cell is constituted by two monomolecular layers one of which comprises a first organic compound having a predetermined tunnel barrier and the other of which comprises a second organic compound having a tunnel hopping barrier lower than the first compound and low mobility molecules; and (3) A memory unit cell is constituted by two types of monomolecular films having different tunnel hopping barriers and different molecular lengths, the film having a low tunnel hopping barrier being constituted by a plurality of monomolecular films.

If the above charge limiting countermeasures are provided, and the memory unit cells are arranged in an array as in the conventional device, a very large integrated memory medium of a higher perfection can be manufactured. For example, if a basic measure of a tunnel unit is 1 $\mu m^2$ and the number of layers is 1,000, a memory having a density of $10^9$ bits/cm$^2$ can be prepared.

When the charge spreading limiting cuntermeasure is applied to the above memory system, charge overlapping in units of write bits can be eliminated. Therefore, the memory system can be used as an analog memory. For example, if a black-and-white image is to be stored, the amount of injected charge can be controlled according to a density pattern, and the amounts of charge corresponding to the density pattern can be stored in the memory unit cells, respectively. In the case of a full-color image, the three primaries are separated into corresponding color components, and the memory elements are arranged in units of color components. The signals read out from the memory elements are mixed to obtain a color image. In this manner, a color image memory can also be obtained.

FIGS. 8A to 8C show a first embodiment of the present invention. As shown in FIG. 8A, a memory unit cell is constituted by two monomolecular films having different $\Delta\phi$ and d values. In this case, the monomolecular films are selected to satisfy inequalities $d_0 > > d$ and $\Delta\phi_0 < \Delta\phi$. If these inequalities are satisfied, potential barrier $\Delta\phi_0$ of monomolecular film A in a high electric field can be lowered, and width $d_0$ is also effectively narrowed. However, the potential barrier of monomolecular film B is not greatly changed. As shown in FIG. 8B, the charge can jump film A in the high electric field. However, the charge cannot tunnel hop film B in a period of time short enough to tunnel hop film A. In other words, the charge is transferred through only monomolecular film A, thereby limiting spreading of the charge.

In a low electric field, the reduced amount of barrier $\Delta\phi_0$ value of film A the $d_0$ value are effected. In this case, the charge cannot tunnel hop monomolecular film A, but can tunnel hop film B since the d value is sufficiently smaller than the $d_0$ value, as shown in FIG. 8C. In this case, the $\Delta\phi_1$ value must be selected to be somewhat larger than the $\Delta\phi_0$ value, thus increasing probability for tunnel hopping. Therefore, all charges can jump within a predetermined period of time that is longer than the time required for causing the charge to jump barrier $\Delta\phi$.

When tunnel hopping of the charge over barrier $\Delta\phi$ is effected, a low electric field is continuously applied to the memory device until all charges completely jump barrier $\Delta\phi$. Therefore, the charge can be transferred without being spread. When the applied electric field is withdrawn from the memory device, the charge is stored in portion B' to store information, as shown in FIG. 8A.

Examples of the material for monomolecular film A are arachidic acid ($\Delta\phi_0 \approx 0.42$ eV) and stearic acid, and an example of the material for monomolecular film B is anthracene ($\Delta\phi \approx 0.7$ eV).

In the first embodiment, the large electric field is, usually, $3 \times 10^6$ to $4 \times 10^6$ volt/cm and the small electric field is $1 \times 10^5$ to $5 \times 10^5$ vol/cm. The large electric field is applied for 0.1 msec to 0.2 msec and the small electric field is applied for 1 msec to 5 msec.

Figure 9A:
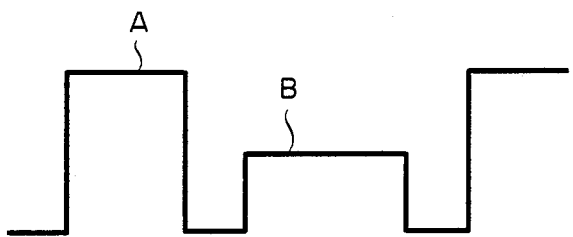
FIGS. 9A to 9C illustrate the second embodiment of the present invention.
Figure 9B:
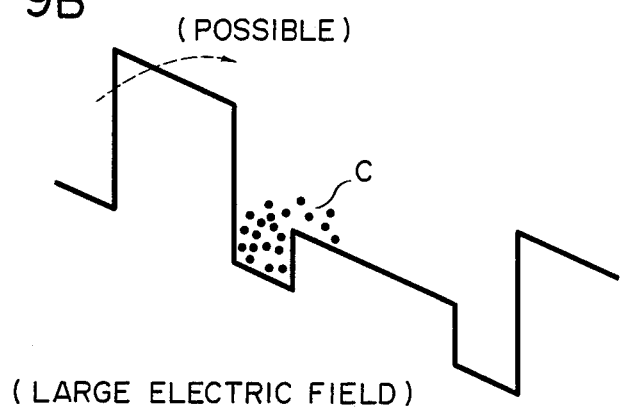
Figure 9C:
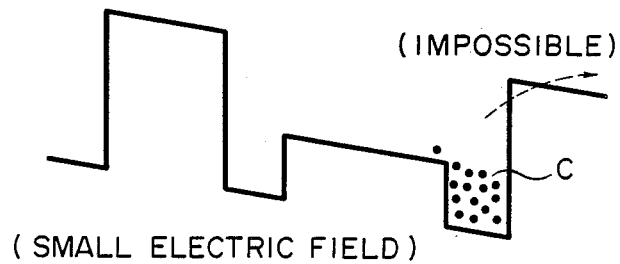

FIGS. 9A to 9C show a second embodiment of the present invention. As shown in FIG. 9A, a memory unit cell is constituted by tunnel hopping barrier molecular film A and low charge mobility molecular film B.

In a high electric field, the charge can easily tunnel hop monomolecular film A, as shown in FIG. 9B. However, in a low electric field, the charge is gradually transferred in low charge mobility molecular film B, but cannot tunnel hop film A, as shown in FIG. 9C.

A sufficiently large electric field is applied to the memory device when the charge tunnel hop monomolecular film A, and a low electric field is applied thereto for a sufficiently long period of time as represented by equation (7) when the charge tunnel hop monomolecular film B. Therefore, the charges can be accurately transferred in units of memory unit cells, thereby limiting spreading of the charge.

An example of the material for monomolecular film A is an unsaturated aliphatic acid such as diacetylene carboxylic acid such as $C_{12}H_{25}C \equiv C—C \equiv C—(CH_2)_8—COOH$. A material for monomolecular film B is one (single bond) having atoms relatively separated from each other, and an example is straight chain aliphatic acid (the molecular weight is large; specifically $C_nH_{2n+1}COOH$ ($n \geq 21$)).

In the second embodiment, the large electric field is preferably $5 \times 10^6$ to $1 \times 10^7$ vol/cm and is applied for $1 \times 10^5$ to $5 \times 10^5$ volt/cm and is applied for 10 msec to 30 msec.

FIGS. 10A to 10C show a third embodiment of the present invention.

As shown in FIG. 10A, two types of monomolecular films having different tunnel hopping barriers and different molecular lengths are used. The film having a lower tunnel hopping is constituted by a plurality of monomolecular films B1 to Bn.

In a large electric field, the charge can easily tunnel hop monomolecular film A serving as a high tunnel hopping molecular film in a short period of time, as shown in FIG. 10B. When the charge completely tunnel hops film A, a low electric field is applied to the memory device. Note that the charge first tunnel hopping film A does not reach Bn while the charge is tunnel hopping film A (i.e., equation (7) is satisfied). The low electric field is continuously applied until the charges are concentrated near Bn. Therefore, the charge pulses can be transferred without leakage, i.e., without causing spreading of the charge.

The material for monomolecular film A is an unsaturated aliphatic acid having a high tunnel hopping barrier, and examples are diacetylene carboxylic acid such as $C_{12}H_{25}C \equiv C—C \equiv C—(CH_2)_8—COOH$ and its derivatives. Monomolecular film B consists of a straight chain aliphatic acid such as $C_{15}H_{31}COOH$. Usually, the high electric field is $5 \times 10^6$ to $10^7$ volt/cm and is applied for 0.1 to 0.5 msec. The low electric field is $10^5$ to $3 \times 10^5$ volt/cm and is applied for 5 to 30 msec when the number of layers of film B is 5.

The present invention is not limited to the particular embodiments described above. Various changes and modifications may be made within the spirit and scope of the invention.

The above description has been concentrated on the structure of the multilayer LB film. The other structural members including the charge introducing means, field applying means and read-out means can be constituted by those described in U.S. Pat. No. 4,534,015 with or without slight modification, which is well within the scope of those skilled in the art.

In the present invention described above, the tunnel hopping can be controlled by application time of high and low electric fields. The application time of the electric fields can be easily determined by measuring the tunnel hopping times of charges in each of the monomolecular films A and B.

According to the present invention, there is provided a three-dimensional tunnel memory device capable of accurately transferring the charge in a state wherein spreading of the charge is limited. Thus, the three-dimensional tunnel memory device may be used as an analog signal memory as well as a binary signal memory.

What is claimed is:

1. In a three-dimensional tunnel memory device including a Langmuir-Blodgett film having opposed faces with multiple layers interposed therebetween, wherein each of said layers is adapted to store an electric charge, said layers having given tunnel barrier, molecular length and molecular mobility characteristics, means for introducing charges into one of the faces of the film in a time sequence corresponding to information to be stored, means for applying an electric field between the faces of the film to cause the charge stored by any of said layers to be transferred to an adjacent layer, and means for reading out a sequence of charges stored by the film, the improvement wherein said Langmuir-Blodgett film includes memory unit cells each comprising adjacent layers formed, respectively, of different kinds of organic compounds in contact with each other, said adjacent layers having, respectively, different tunnel barriers and one of different molecular length and molecular mobility characteristics, and wherein said means for applying an electric field applies an electric field of one magnitude to one of said layers of a selected memory unit cell and an electric field of a different magnitude to another layer of said selected memory unit cell thereby allowing the stored charge in each layer of the selected memory unit cell to hop the tunnel barrier.

2. The device according to claim 1, wherein each memory unit cell comprises a first monomolecular layer comprising a first organic compound having a large molecular length and low tunnel hopping barrier, and a second monomolecular layer comprising a second organic compound having a molecular length smaller than said first compound and a tunnel hopping barrier lower than said first compound; the first and second monomolecular layers are stacked such that the first layer contacts the second layer, thereby forming said multilayer LB film; the charge stored in the first layer is caused to tunnel hop the first layer by applying, by said field applying means, a large electric field for a predetermined period of time to the memory unit cell; and the charge stored in the second layer is caused to tunnel hop the second layer by applying, by said field applying means, a small electric field for a period of time longer than that of the application of said high electric field to the memory unit cell.

3. The device according to claim 1, wherein each memory unit cell comprises a first monomolecular layer comprising a first organic compound having a predetermined tunnel hopping barrier, and a second monomolecular layer comprising a second organic compound having a tunnel hopping barrier lower than said first compound and a small charge transfer degree; the first and second monomolecular layers are stacked such that the first layer contacts the second layer, thereby forming said multilayer LB film; the charge stored in the first layer is caused to tunnel hop the first layer by applying, by said field applying means, a large electric field for a predetermined period of time to the memory unit cell;

and the charge stored in the second layer is caused to tunnel hop the second layer by applying, by said field applying means, a small electric field for a period of time longer than that of the application of said high electric field to the memory unit cell.

4. The device according to claim 1, wherein each memory unit cell comprises a first monomolecular layer comprising a first organic compound having a predetermined molecular length and predetermined tunnel hopping barrier, and a plurality of said second monomolecular layers comprising a second organic compound having a molecular length smaller than said first compound and a tunnel hopping barrier lower than said first compound; the first and second monomolecular layers are stacked such that the first layer contacts an adjacent one of the second layers, thereby forming said multilayer LB; the charge stored in the first layer is caused to tunnel hop the first layer by applying, by said field applying means, a large electric field for a predetermined period of time to the memory unit cell; and the charge stored in the second layers is caused to tunnel hop the second layers by applying, by said field applying means, a small electric field for a period of time longer than that of the application of said high electric field to the memory unit cell to collect the charge in the last layer of the second layers.

* * * * *